(12) United States Patent
Schatzberger et al.

(10) Patent No.: US 7,903,018 B2
(45) Date of Patent: Mar. 8, 2011

(54) ANALOG/DIGITAL CONVERTER ASSEMBLY AND CORRESPONDING METHOD

(75) Inventors: Gregor Schatzberger, Graz (AT); Gilbert Promitzer, Mureck (AT)

(73) Assignee: austriamicrosystems AG, Unterpremstätten (AT)

( * ) Notice: Subject to any disclaimer, the term of this patent is extended or adjusted under 35 U.S.C. 154(b) by 0 days.

(21) Appl. No.: 12/296,228

(22) PCT Filed: Mar. 30, 2007

(86) PCT No.: PCT/EP2007/002903
§ 371 (c)(1),
(2), (4) Date: Sep. 29, 2009

(87) PCT Pub. No.: WO2007/115710
PCT Pub. Date: Oct. 18, 2007

(65) Prior Publication Data
US 2010/0060500 A1 Mar. 11, 2010

(30) Foreign Application Priority Data

Apr. 4, 2006 (DE) .................. 10 2006 015 762

(51) Int. Cl.
*H03M 1/12* (2006.01)
(52) U.S. Cl. .................. 341/172; 341/155
(58) Field of Classification Search .......... 341/155, 341/172, 144, 164, 165, 163
See application file for complete search history.

(56) References Cited

U.S. PATENT DOCUMENTS

| 5,581,252 | A  | * | 12/1996 | Thomas ............... 341/144 |
| 6,633,273 | B2 | * | 10/2003 | Ikeda et al. .......... 345/99 |
| 6,674,386 | B2 | * | 1/2004  | Carreau et al. ...... 341/155 |
| 6,731,232 | B1 |   | 5/2004  | Kearney |
| 7,432,844 | B2 | * | 10/2008 | Mueck et al. ........ 341/163 |
| 2005/0200510 | A1 | | 9/2005 | Yoshida et al. |
| 2006/0158365 | A1 | * | 7/2006 | Kernahan et al. .... 341/155 |
| 2008/0198056 | A1 | * | 8/2008 | Hurrell ............... 341/155 |

FOREIGN PATENT DOCUMENTS

EP 1 093 229 4/2001
WO WO 2005/096503 10/2005

OTHER PUBLICATIONS

R.K. Hester et al, "Fully Differential ADC with Rail-to-Rail Common-Mode Range and Nonlinear Capacitor Compensation", IEEE Journal of Solid-State Circuits, IEEE Service Center, vol. 25, No. 1, pp. 173-182, Feb. 1, 1990.

* cited by examiner

*Primary Examiner* — Peguy JeanPierre
(74) *Attorney, Agent, or Firm* — Cohen Pontani Lieberman & Pavane LLP

(57) ABSTRACT

An analogue/digital converter arrangement and a method. A differential input voltage is converted by means of a differentially implemented capacitative voltage divider that comprises two programmable capacitor banks (3, 4), and with the aid of the comparator (6) into a digital output signal.

24 Claims, 6 Drawing Sheets

ANALOG/DIGITAL CONVERTER ASSEMBLY AND CORRESPONDING METHOD

RELATED APPLICATIONS

This is a U.S. national stage under 35 USC §371 of application No. PCT/EP2007/002903, filed on Mar. 30, 2007.

This application claims the priority of German application no. 10 2006 015 762.1 filed Apr. 4, 2006, the entire content of which is hereby incorporated by reference.

FIELD OF THE INVENTION

The present invention concerns an analogue/digital converter arrangement and a method for analogue/digital conversion of an analogue signal into a digital signal.

BACKGROUND OF THE INVENTION

Analogue digital converters, abbreviated to ADC, have many varied applications in electronic signal processing. The outputs of sensors are most commonly available as analogue signals, and must first be appropriately converted before further digital processing. A problem that frequently occurs at this stage is that the output voltages from the sensors are larger than the range of input voltages suitable for analogue/digital converters implemented in conventional semiconductor technologies. These are constructed on integrated circuits employing, for instance, bipolar, unipolar or a mixed technology such as BiCMOS, and usually have permitted voltage ranges of only a few volts.

In order to the able to handle signals with greater amplitudes, the analogue/digital converter can be built in what is known as a high-voltage technology using, in other words, an integrated circuit technology that, as a result of appropriate measures, can withstand higher voltages of, for instance, 10 volts or more. Alternatively, the sensor's output signal can be sufficiently attenuated that it lies within the permitted range of input voltages of a conventional ADC.

A disadvantage to making ADCs in high-voltage technology is that the conversion rates are significantly lower than is the case for conventional low-voltage ADCs. The reason for this is that, in order to achieve the higher breakdown voltages, high-voltage transistors have larger dimensions and are therefore slower.

Attenuation of the signal by means, for instance, of a resistive voltage divider at the input to the ADC in order to transform an input signal with a greater amplitude down to one within the range of voltage permitted for the ADC, has the disadvantage that the voltage divider presents an ohmic load to this source at the input of the ADC, and also that the current consumption of the ADC is greater, since a current path through the voltage divider is always available.

Document U.S. Pat. No. 6,731,232 B1 describes an ADC that operates according to the principle of successive approximation. In order to achieve a programmable input voltage range, a high-voltage sampling switch is provided at the input. This is not preceded by any additional attenuator circuits. This permits the input voltage to be directly sampled on one or more sampling capacitors. The analogue input can be scaled or attenuated in order to match the dynamic range of the ADC. This allows the processing of voltages larger than the permitted input voltages found on conventional integrated circuit technologies, which may also be referred to as low-voltage technologies. As is shown, for instance, by FIG. 4 of the US document mentioned, a reference voltage Vcom, to which all the capacitances in the AD converter are connected, is required for operation of the comparator. To ensure adequate drive, the Vcom signal needs to be buffered by an amplifier. This, in turn, entails increased current consumption by the ADC. As is shown in FIG. 2 of the document cited, a large number of high-voltage switches are required at the input to the ADC, and these, in turn, have a large space requirement. In addition, voltages can occur at the comparator input that are larger than the permitted low-voltage range. The reason for this is that, at the lowest programmed input voltage range, a voltage present at the input, which is smaller than the high supply voltage but significantly larger than the permitted input voltage of the ADC, is indeed attenuated by the voltage divider, but input voltages at the comparator occurring during the successive approximation can damage the gate oxide of its input transistors or can break it down.

SUMMARY OF THE INVENTION

One object of the present invention is to provide an arrangement for analogue/digital conversion and a method for analogue/digital conversion that is suitable for processing large input voltages but that can be implemented at low expense.

This and other objects are attained in accordance with one aspect of the present invention directed to an analogue/digital converter arrangement comprising a differential input to which an analogue signal can be supplied, a differentially implemented capacitive voltage divider that can be connected to or disconnected from the differential input and that comprises at least two programmable capacitor banks, a comparator with inputs that are connected to the differentially implemented, capacitive voltage divider, and an output to the converter arrangement, coupled to an output of the comparator, for the provision of a digital signal derived from the analogue signal.

It is possible with the aid of the differentially implemented, capacitive voltage divider to divide a high input voltage down to a voltage that is suitable for the comparator. A differential analogue signal is first divided by the capacitive voltage divider, which is also differential in structure, and converted by means of the comparator into a corresponding digital signal. The fully differential structure yields the particular advantage of low expense, as will be explained below using examples.

In one embodiment, a fully differential analogue/digital converter (ADC), operates according to the successive approximation method, which can also be described as a balancing method. The ADC comprises switchable capacitors and a programmable input voltage range.

Favorably, the programmable capacitor banks are charged to the voltage that is present at the input. This charge is then converted through successive approximation to the equivalent digital value. The input here has a differential implementation, and it is favorable for the difference between a positive and a negative reference potential to serve as the reference. If the input voltage is larger than the difference between the reference voltages, then favorably not all the capacitors of the programmable capacitor bank are connected to the input in the sampling phase, but in both cases only a specific fraction, while the rest of the capacitors are connected to an appropriate reference voltage. This creates a capacitive voltage divider, and the input signal is attenuated in proportion to the ratio of the programmed capacitances.

A control unit is favorably provided, the input of which is connected to the output of the comparator, and the output of which is connected to the programmable capacitor banks in order to operate them. The output of the converter arrangement is also favorably made available to the control unit.

In one embodiment the control unit comprises a programming input for selection of a voltage divider ratio. In this way the ratio of the input voltage range to the reference voltage or to the reference voltage difference is favorably specified.

In one embodiment, the control unit is set up in such a way that, during a sampling phase of the converter arrangement, it provides attenuation to the analogue signal by connecting a portion of the capacitors in the capacitor banks to the differential input and connecting another portion to a reference voltage.

In one embodiment, means for executing successive approximation during a charge transfer phase are available. In this case, conversion of the charge stored in the capacitor bank into the digital signal is carried out in the charge transfer phase.

In a discharge phase of the converter arrangement, it is favorable to equalize the potentials on the capacitors in the capacitor banks. It is favorable here for all the capacitors to be brought to the same potential, or for all the capacitors to be discharged.

A sampling arrangement favorably comprises two sampling switches that permit a sample of the analogue input voltage to be placed on the capacitors or onto a portion of the capacitors in the capacitor bank.

The sampling equipment furthermore comprises a further sampling switch which, during the sampling phase, short-circuits the inputs of the comparator, so connecting one terminal of each of the two capacitor banks together.

The sampling switches favorably comprise high-voltage transistors. High-voltage transistors are characterized by an ability to withstand higher voltages or to be operated at higher voltages than the transistors usually found in the technology concerned. High-voltage transistors may be bipolar or unipolar.

A symmetrical circuit node is favorably formed between the differentially implemented, capacitative voltage divider and the sampling switches. In one embodiment this is connected, with inversion, through first bypass switches to the inputs of the comparator. Favorably, an attenuation capacitor is provided for each which, during the discharge phase, connects each input of the comparator with one terminal each of a differential reference signal.

In the charge transfer phase the attenuating capacitors in one embodiment also connect the differential reference voltage to the differential input of the comparator.

In the charge equalization or discharge phase, on the other hand, it is favorable if the attenuating capacitors are connected between the symmetrical circuit nodes and the inputs of the comparator, i.e. in parallel to the capacitors of the capacitor banks.

The switchable capacitors that are provided in the programmable capacitor banks can favorably be switched in or out independently of one another; there is a scaling factor of two between each.

In one embodiment, each capacitor has its own switch that connects a terminal of the capacitor either to a terminal of the differential input of the converter arrangement, to a positive reference signal terminal, or to a negative reference signal terminal. The free end of each capacitor here is favorably connected permanently to an associated input of the comparator.

The switches associated with the capacitors are also favorably implemented using high-voltage transistors.

For operation of the high-voltage transistors it is favorable to provide at least a means of level conversion that joins the control unit to the relevant control inputs of the high-voltage transistors.

Another aspect of the present invention is directed to a method for analogue/digital conversion of a differential analogue signal into a digital signal that comprises attenuation of the differential analogue signal with a differentially structured capacitative voltage divider consisting of at least two programmable capacitor banks by programming the capacitor banks. A differential signal derived from the voltage divider is passed to a comparator. The digital signal is generated depending on the output signal of the comparator.

Favorably the method comprises three phases, namely a sampling phase, a charge transfer phase and a discharge phase.

The differential analogue signal is favorably sampled in the sampling phase. This means that capacitors comprising the capacitor banks are charged according to the programming of the capacitor banks. In the course of a successive approximation, the charge on the capacitors is converted during the charge transfer phase into the digital signal. Before the next sampling cycle, the charges on the capacitors in the programmable capacitor banks are equalized. This may involve bringing the capacitors all to the same potential, or discharging them.

In order to provide a differential capacitative voltage divider, the differential analogue signal is favorably not fed to all the capacitors in the capacitor bank, but only to a first subset of the capacitors. On the other hand, the differential reference signal is applied to a second subset of the capacitors, separate from the first capacitors. The individual capacitors here are either charged to a positive or to a negative reference value.

The switches favorably provided for this purpose are favorably operated by a control unit. The control unit favorably controls the attenuation value or division factor of the voltage divider, which has a capacitative, differential structure, and also serves to control the sequence of the phases that favorably constitute the process, namely the sampling phase, charge transfer phase and discharge phase. For this reason, the control unit favorably operates switches that couple the capacitor banks to the differential input, to the reference terminals, or to the inputs of the comparator.

DETAILED DESCRIPTION OF THE DRAWINGS

Figure 1:
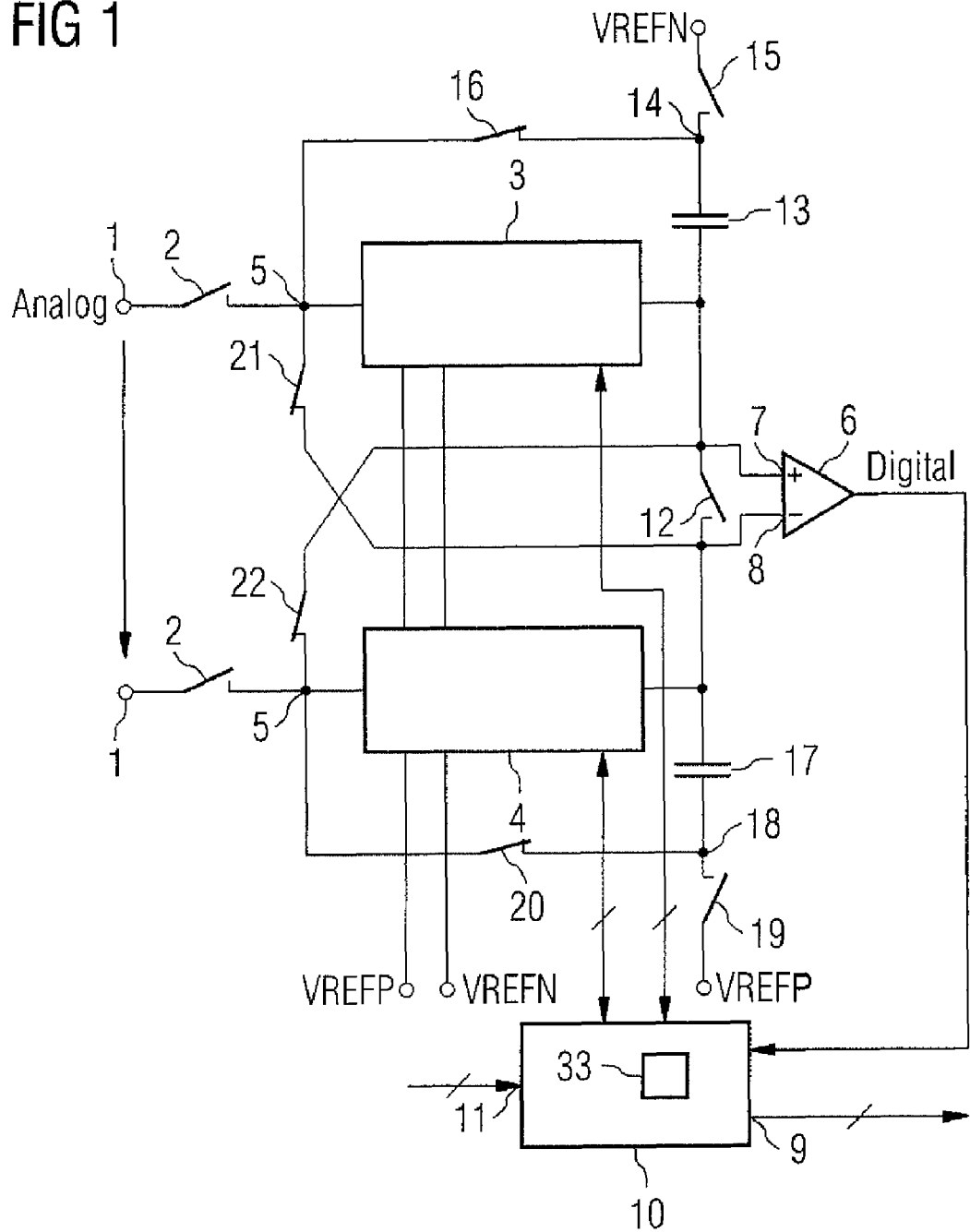
FIG. 1 shows a first embodiment of an AD converter according to the invention.

FIG. 1 illustrates an analogue/digital converter arrangement with a differential input 1. A differentially implemented capacitative voltage divider can be connected to and disconnected from the differential input 1 through two first sampling switches 2. In detail, a first capacitor bank 3 and a second capacitor bank 4 are provided, from each of which one terminal of each is connected to a symmetrical circuit node 5 that is connected to one of the sampling switches 2. A comparator 6 with two inputs 7, 8 is connected at each of the inputs 7, 8 to one of the capacitor banks 3, 4. An output of the comparator 6 is coupled to an output 9 of the converter arrangement. The digital signal is provided at output 9.

A control unit 10 is furthermore provided, whose input is connected to the output of the comparator 6, whose output is connected to the programmable capacitor banks 3, 4 in order to operate them, and where the output 9 of the converter arrangement is formed. The control unit 10 has a programming input 11 with which the voltage dividing ratio of the capacitative voltage divider 3, 4 can be specified.

A further sampling switch 12 switchably connects the inputs 7, 8 of the comparator 6 to one another. The first input 7 is connected through an attenuating capacitor 13 to a circuit node 14 that is connected through a switch 15 to a negative reference voltage terminal Vrefn and through a switch 16 to a terminal of the symmetrical circuit node 5. Correspondingly, another attenuating capacitor 17 is provided that connects the second input 8 of the comparator to a further circuit node 18. The further circuit node 18 is connected through a switch 19 to a positive reference voltage terminal Vrefp, and through a switch 20 to another terminal of the symmetrical circuit node 5. Feedback switches 21, 22 serve as an inverter to switchably connect the symmetric circuit node 5 to the inputs 7, 8 of the comparator 6.

The mode of operation of the circuit according to the invention, as illustrated through the example of FIG. 1, is explained with the aid of the following diagrams and the corresponding switching phases taking a different embodiment as an example.

Figure 2:
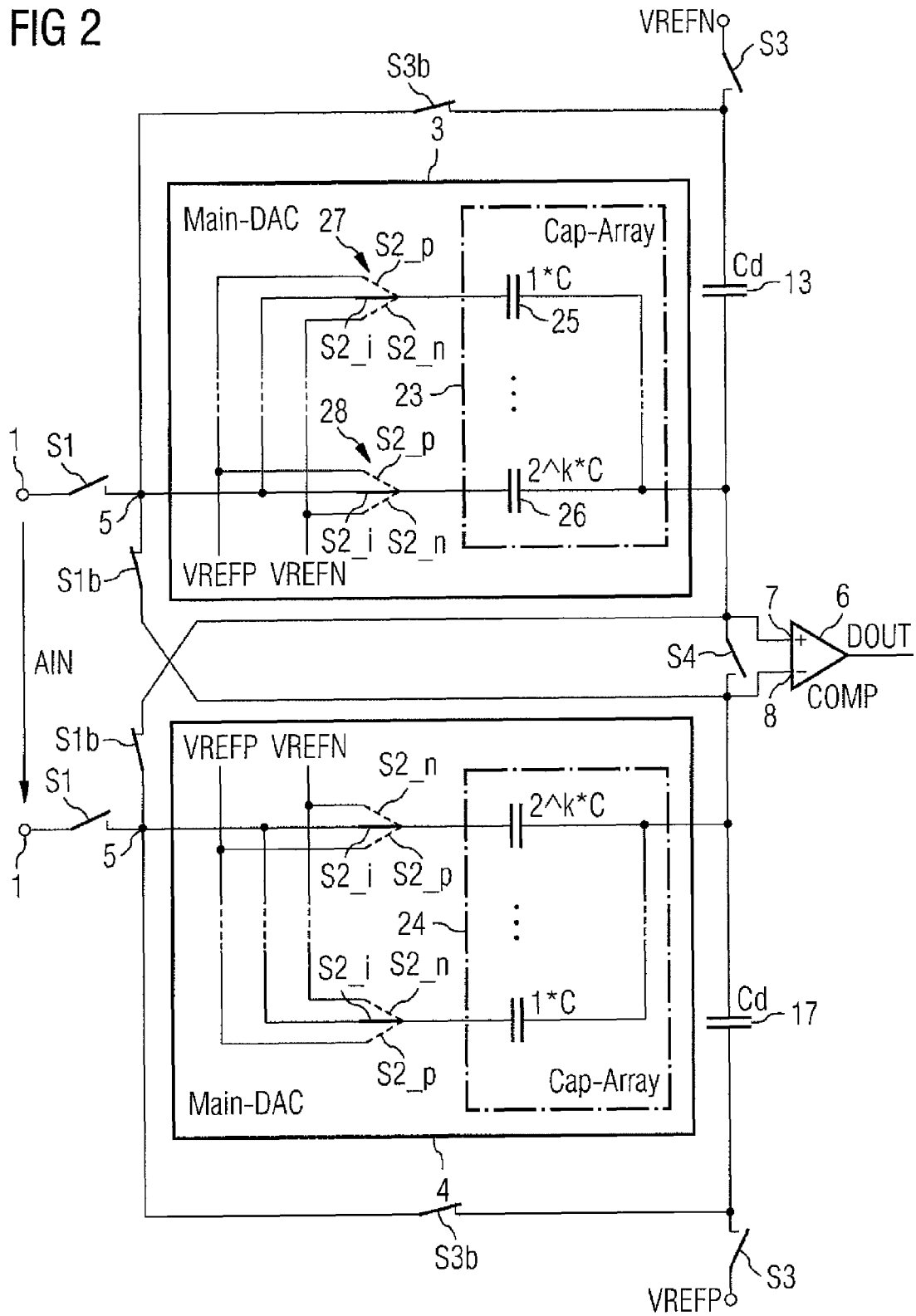
FIG. 2 shows a further embodiment of an AD converter according to the invention, where the switch setting illustrated corresponds to a charge equalization phase.

FIG. 2 illustrates a further development of the circuit of FIG. 1, and corresponds to it largely in terms of the components used and their favorable interconnection. To that extent, the description will not be repeated at this point. The capacitor banks 3, 4 comprise the actual array of capacitors 23, 24, each of which consists of a large number of capacitors scaled by a scaling factor of two. The values of the graduated capacitors, for instance, are in the ratio of one C, two C, four C, eight C and so on. By segmenting the capacitors of higher values (i.e., splitting them into two or more capacitors which are connected to each other in series and/or in parallel in order to achieve the desired total value), an additional improvement can be achieved, for instance by means of uniform capacitors or having the same value of capacitance and which are appropriately interconnected to give scaling by a factor of two. One terminal of each of the capacitors of the first capacitor bank 3 are connected together and with the first input 7 of the comparator 6. Another terminal of the capacitors 25 to 26 of the capacitor bank 3 is optionally connected through a switching unit 27 to 28 to a terminal of the symmetrical circuit node 5, with the positive reference voltage terminal Vrefp or with the negative reference voltage terminal Vrefn. The control unit 10, which is not shown in FIG. 2, is then able to connect each capacitor 25 to 26 of the capacitor bank, independently of one another, to the terminal of the symmetrical circuit node 5 or with one of the reference voltage terminals Vrefp, Vrefn.

In a similar way, the second capacitor bank 4 is connected between the further terminal of the symmetrical circuit node and the second terminal 8 of the comparator 6, where again each capacitor can be switched, independently of one another, to connect to the positive or negative reference voltage terminal Vrefp, Vrefn.

The two sampling switches S1, which connect the input 1 to the symmetrical circuit node 5 in a differential signal path, are implemented as high-voltage transistors. Similarly, all the switches in the switching units 27, 28, in the first capacitor bank 3, and the corresponding switches in the second capacitor bank 4, are also implemented with high-voltage transistors. High-voltage transistors also constitute those switches that connect the attenuating capacitors 13, 17 to the reference voltage terminals Vrefn, Vrefp, shown on FIG. 2 as S3. The switches S3B that connect the attenuating capacitors 13, 17 to the symmetrical circuit node 5 are also implemented with high-voltage transistors. This is also true of the further sampling switch S4 that is able to short-circuit the comparator inputs 7, 8.

An input stage of the comparator 6 is also constructed with high-voltage transistors, whereas the rest of the comparator can be implemented with conventional, low-voltage transistors.

The control unit 10 favorably comprises means for level conversion 33, used to drive the switches S1, 27, 28, 83, S4 and S3B, that contain the high-voltage transistors.

The control unit 10, which can comprise the drive logic for the switches and the input voltage range switchover logic for the selection of the input voltage range, can entirely be constructed with low-voltage transistors.

During the successive approximation process, the attenuating capacitors 13, 17 prevent charge being lost by overshoot.

The switches S1, 27, 28, along with the switches in capacitor bank 4 and switch S3B are all particularly exposed to the full, unattenuated input voltage, and should therefore be implemented in high-voltage technology. Although the further sampling switch S4 and the comparator input see the unattenuated input signal, which lies within the difference between the reference voltages at the terminals Vrefp, Vrefn, the common component of the attenuating input voltage can nevertheless exceed the permitted low-voltage range. Implementing switch S4 and the input transistors to the comparator in high-voltage technology is therefore also to be recommended.

The common mode component can be anywhere within the input voltage range.

The input to the comparator S6 and the switch S4 can therefore withstand input voltages that are too large. Switches S3, which connect the attenuating capacitor to the reference voltage terminals, can be implemented in low-voltage technology, since during discharge, when both switches are open, only the voltages on the capacitor arrays 3, 4 are present, and these are within the range of reference voltages.

Favorably, the AD converter does not require an amplifier to define the sum of the two arrays 3, 4 during the sampling phase. This significantly reduces the current consumption. A voltage source, not illustrated, connected to input 1, only sees half the capacitance. The voltage falling away at switch S4 during the sampling phase is stored in the offset correction capacitors contained in comparator 6, and therefore favorably compensated. Switch S4 can be opened at the end of the sampling phase. The "charge injection" effect that is caused here is divided between both capacitor banks 3, 4, and therefore does not cause any relevant error. The charge injection of the sampling switch always, on the other hand, presents a problem to single-ended circuit versions, but this is avoided in the present case.

The input voltage range at input 1 can be freely selected up to the level of the positive and negative high-voltage supplies. The reference voltage range can also be freely selected within the range of the low-voltage power supply, according to the application.

Apart from the comparator, the speed of the proposed AD converter is not significantly limited by the structure and connection of the capacitor banks with their capacitative voltage divider functionality in their digital implementation. The high-voltage input transistors that are favorably included in the comparator 6 also do not significantly slow the comparator.

The fully symmetrical structure yields high immunity to interference.

If, in further developments, the resolution of the AD converter is to be improved further, it is possible for the smallest capacitor in the graduated capacitor bank, which is controlled by the LSB (least significant bit), to be replaced by other capacitor banks or to be expanded.

The conversion process of the proposed analogue/digital converter is divided into three steps, described in detail below.

Figure 3:
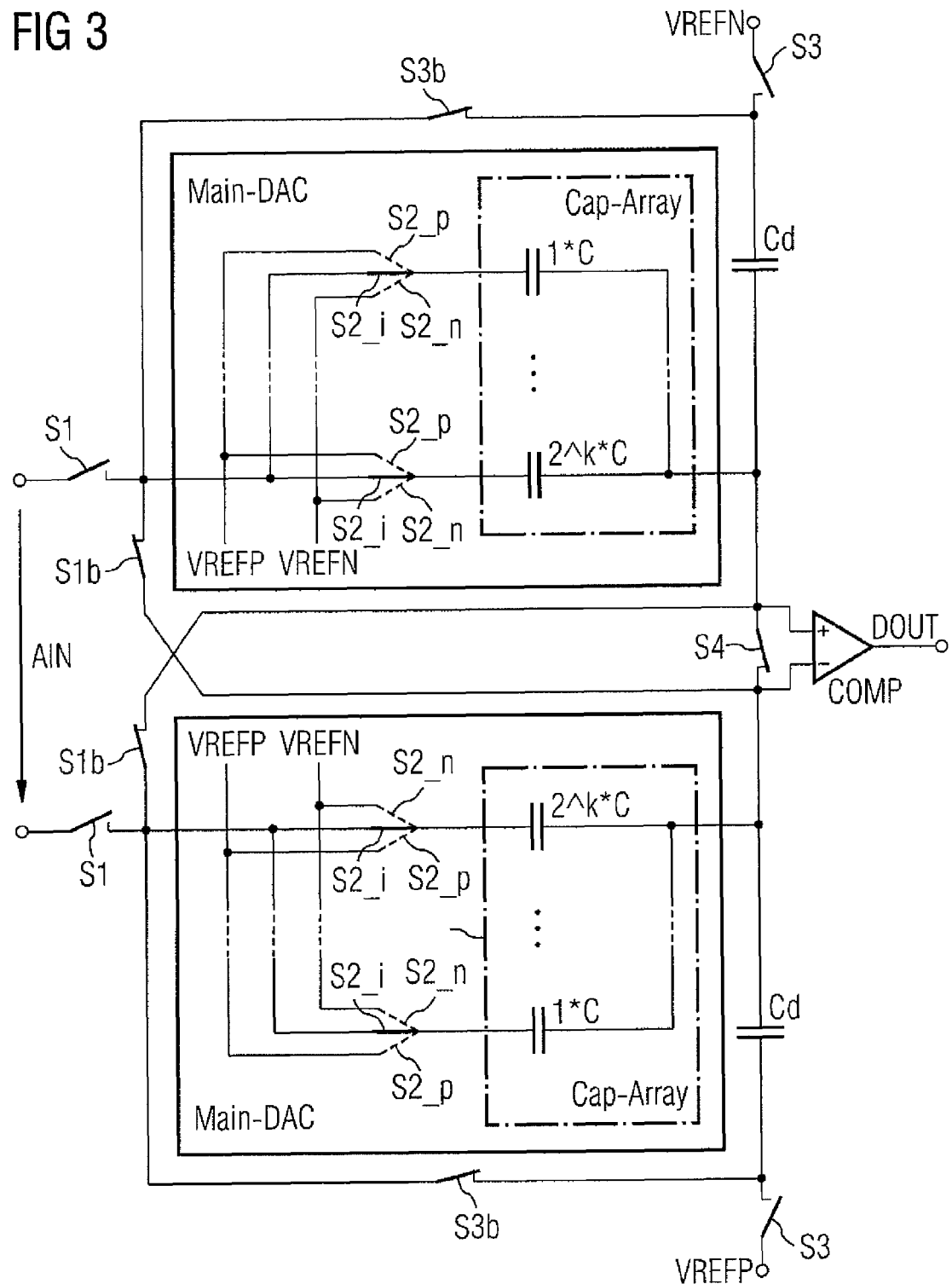
FIG. 3 shows the circuit of FIG. 2 where, however, a discharge is illustrated.

Before starting the conversion process itself, all the capacitors in the capacitor banks 3, 4 and the corresponding attenuation capacitors 13, 17 are charged to the same potential and/or are discharged. For this purpose, two different examples of the charge equalization or discharge processes are illustrated by FIGS. 2 and 3. The fully differential ADC using successive approximation with switched capacitances and programmable input voltage range according to FIG. 2 is shown in the charge equalization phase.

FIG. 2 illustrates the configuration of the switches with which the charge on the capacitors in a capacitor bank are equalized with the associated attenuation capacitance. In order to permit this charge equalization, the inputs of the AD converter itself are separated from the input 1 by opening switch S1. Switches S1B and S3B are closed. In addition, all the capacitors are connected to the summing node 5 by means of switch units 27, 28. The further sampling switch S4, and the connecting switch S3 to the reference inputs are open. Similarly, capacitors 25 to 26 are not connected to the reference voltage terminals Vrefp, Vrefn of the capacitor banks. Accordingly, in FIG. 2 all the capacitors in the capacitor banks and the attenuation capacitors 13, 17 are connected in parallel, as a result of which these capacitors are charged to the same potential. Were the same input voltage always to be presented to the analogue/digital converter, a source at the input 1 would experience almost no loading.

FIG. 3 illustrates an alternative embodiment of the charge equalization phase. In this case, the charge equalization is taken further, to a discharge in the strict sense. For this purpose, all the capacitors in the capacitor banks 3, 4, and the two attenuating capacitors, are connected in parallel, and are discharged through sampling switch 4 which in FIG. 3, in contrast to FIG. 2, is closed. Other than this, FIGS. 2 and 3 are identical.

The advantage of discharging in accordance with FIG. 3, as against the charge equalization of FIG. 2, is that the capacitors require a charge transfer equivalent to at most half the reference voltage from a source at the input 1. As a result, the loading on the source at the input is only a half of what it is in the version of the circuit according to FIG. 2.

The feedback of the capacitor array can also be provided directly from its own array, which again further simplifies the layout. The feedback switch S1B and the sampling switch S1 are, in a favorable embodiment, divided like the capacitors as an array, as a result of which there are quadruple T-gates at each capacitor. In this way the series connection of T-gates is omitted, and the linearity of the ADC is further improved. In addition, the surface area is further reduced.

Figure 4:
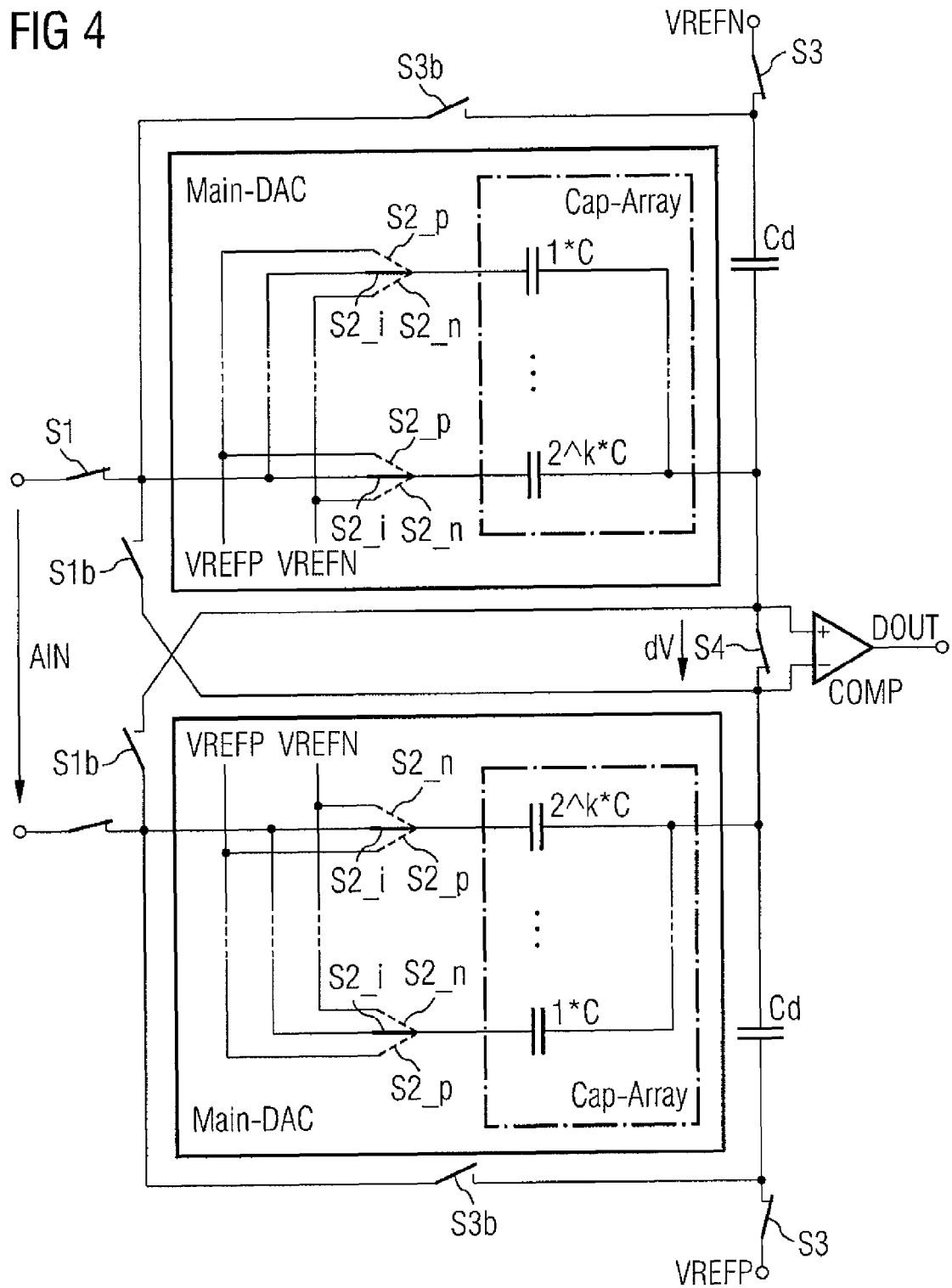
FIG. 4 shows the circuit of FIG. 2 in a sampling phase.

FIG. 4 also shows the circuit of FIGS. 2 and 3, but this time the switches are in the configuration for the sampling phase. In this phase, the voltage at the input 1 is stored on the capacitors of the capacitor banks 3, 4. Switches S1B and S3B are open for this purpose. The sampling switch S1 and the further sampling switch S4 are closed. Depending on the input voltage, all the capacitors in the two arrays 3, 4 may be connected to the input, or only a fraction of these capacitors may be connected in order to attenuate the input voltage. The latter case corresponds to a capacitative voltage divider. The degree of attenuation can be set externally through a digital interface, for instance by means of the programmable control unit 10 of FIG. 1. Here, the control unit for the ADC favorably comprises a memory where the programming is stored, and which is converted during the sampling phase into the correct switch settings at the capacitors. If no attenuation is active, both capacitor arrays 3, 4 are connected in series, and each is connected with an input voltage through the sampling switch. If, on the other hand, the input signal has to be attenuated, in each capacitor bank 3, 4 the same capacitative voltage divider is configured by means of the relevant switches S2I, S2P, S2N according to the programmed attenuation. Here, only a fraction of the capacitors are connected to the input 1, while the remainder of the capacitors in one of the banks is connected to Vrefp and in the other bank to the negative supply voltage terminal Vrefn. Because, in each case, a further terminal of the capacitors in the capacitor bank is permanently connected to an input of the comparator 6, this is equivalent to a tap in the voltage divider.

As shown in FIG. 4, the attenuation capacitors 13, 17 are also connected to the differential supply potential terminals Vrefn, Vrefp.

When programmed attenuation is active, the voltage present at the input 1 is attenuated, part of it being stored in a first capacitor bank 3, the other parts of the attenuated input voltage being stored in the other capacitor bank 4, according to the programmed capacitor configuration.

Any voltage drop that might occur across the further sampling switch S4 as a result of changes in voltage at the input is stored at the same time in the comparator's offset correction capacitors that are favorably provided, and can therefore be compensated for in a further development of FIG. 4.

The summing node of the capacitors is not pulled to a specific potential by an auxiliary voltage. This permits a further reduction in current consumption. The reference voltages at the terminals Vrefp, Vrefn can in this embodiment of the circuit be freely selected within the range of the low-voltage power supply.

Opening the additional sampling switch 54 completes the sampling phase. Any charge injection that might arise when opening the sampling switch is distributed in this circuit equally across both capacitor banks, and is therefore unable to cause a relevant error. The sampling switches S1 are favorably not opened until, after opening the further sampling switch S4, the charge has been properly stored on the capacitors.

Figure 5:
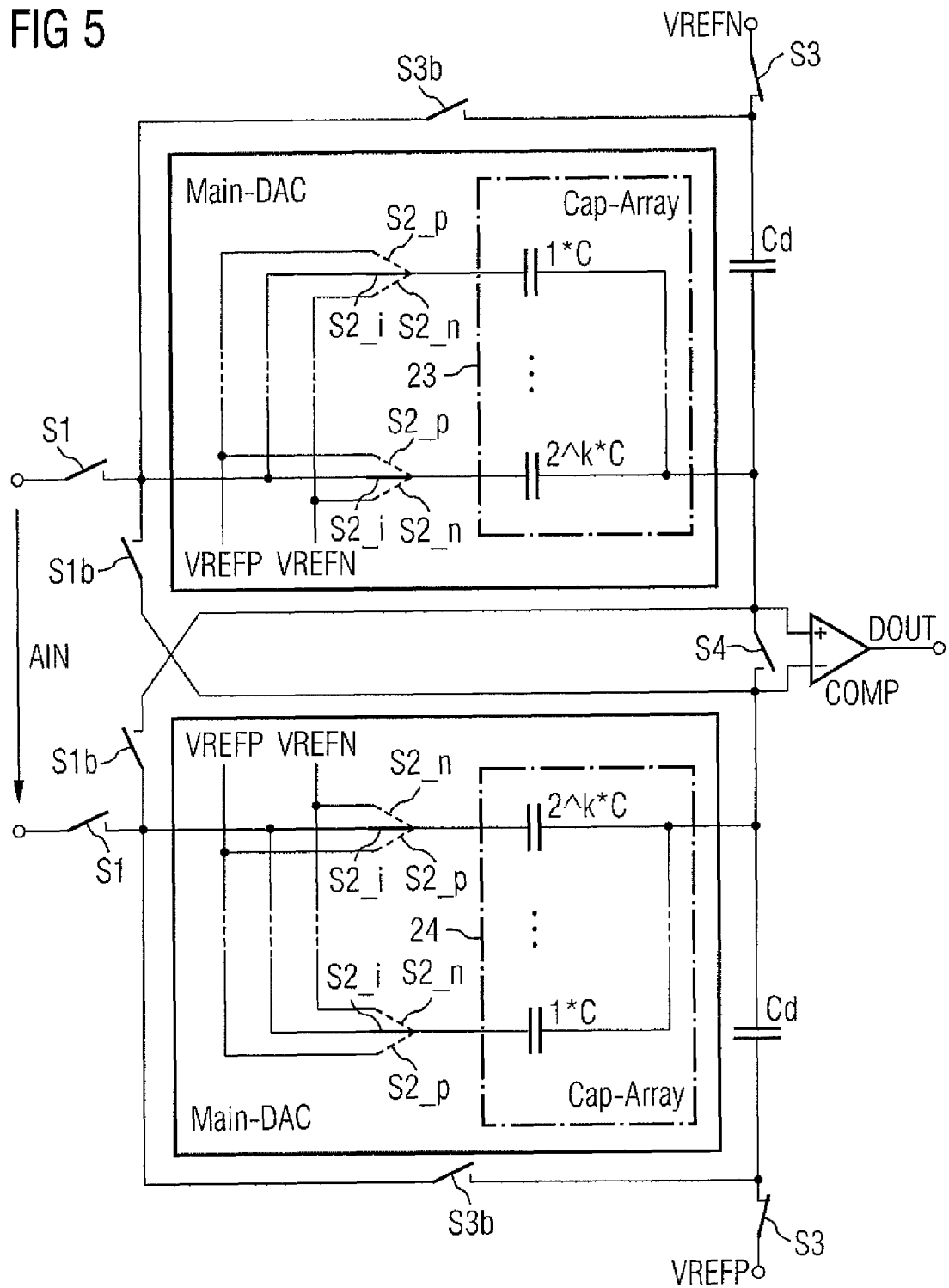
FIG. 5 shows the circuit of FIG. 2 in a charge transfer phase.

FIG. 5 finally illustrates the successive approximation phase, also referred to as the charge transfer phase. The switch setting corresponds to that of the sampling phase, with the exception, as described, that all the sampling switches S1, S4 are open.

In the charge transfer phase, the charge stored in the capacitor banks is converted to an equivalent digital value. Depending on the previously stored, attenuated or unattenuated input voltage Ain, the individual capacitors in the capacitor banks 3, 4, are connected by switches that constitute part of the capacitor banks to one of the reference voltage terminals Vrefp or Vrefn. In successive approximation of this type the analogue input signal, attenuated or unattenuated, depending on the programming of the input area, is, as usual, converted in n steps into a digital code with n bits. The attenuation capacitors prevent any loss of charge that could occur through overshoots during the successive approximation. If, in alternative embodiments, the range of the reference voltage is correspondingly restricted, the attenuation capacitors 13, 17 can also be omitted. The number of possible range changes depends on the resolution of the capacitor banks. If, for instance, their resolution is six bits, it is possible to select between 64 different ranges. In most cases, however, only a reduced number of switchable ranges is required.

If the number of switchable ranges, that is the maximum possible number of capacitative divider ratios, is small in comparison to the resolution of the ADC, it is favorable to significantly reduce the number of switches implemented in high-voltage technology. For this purpose, in one modification, the capacitor banks 3, 4 of the ADC are converted to a sampling DAC, and the attenuation capacitors used as new capacitor banks. The number of switchable ranges also defines the resolution of the sampling DAC. The resolution of the new capacitor banks used for the charge transfer is given by the structure of the ADC. In this version, all the switches in the new capacitor banks can be implemented using low-voltage transistors. Here, only the sampling DAC is connected to the input during the sampling phase. The input signal is attenuated by the voltage divider of the sampling DAC and the new capacitor banks, according to the programmed input voltage range. The attenuated input signal is then converted in the successive approximation phase from the new capacitor banks into the appropriate digital value. Here, however, the linearity and offset properties must be weighed against the saving in high-voltage transistors.

Figure 6:
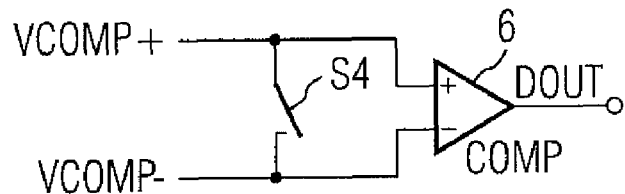
FIG. 6 shows a first example of an embodiment of the further sampling switch.

FIG. 6 illustrates the embodiment of the further sampling switch S4 at the input of the comparator 6, as is used in FIGS. 1 to 5.

In this embodiment, the common mode component of the input voltage is limited to the arithmetic mean of the values at the reference voltage terminals Vrefp, Vrefn, namely $$\frac{Vrefp + Vrefn}{2}.$$

The reason for this is that, after the successive approximation, the mean value $$\frac{Vrefp + Vrefn}{2}$$

is always present at the comparator. If the common mode component of the input voltage differs from this, the comparator will make its comparisons during the sampling phase with reference to a different working point from that which will be present at the end of the successive approximation process.

If the common mode component is restricted to $$\frac{Vrefp + Vrefn}{2},$$

then the cross-connection switch 54 and the input stage of the comparator can be implemented using low-voltage transistors.

Figure 7:
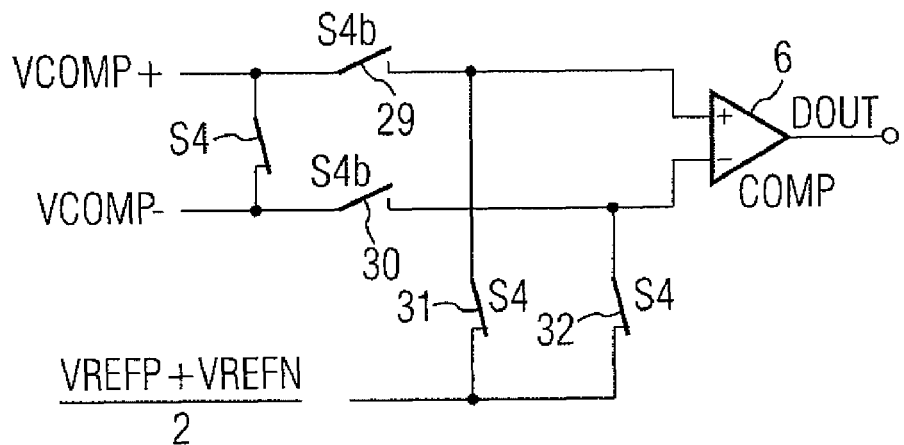
FIG. 7 shows a second example of an embodiment of the further sampling switch.

FIG. 7 illustrates an alternative embodiment of the sampling switch S4, in which two additional series switches S4B are connected between the cross-connection switch S4 and the inputs to the comparator 6. A common connection node is created at each input of the comparator 6, in each case through an additional switch 31, 32, with a potential that is half of the sum of the values of the reference voltages Vrefp, Vrefn. Switch S4 acts as the actual sampling switch. The series switches 29, 30 separate the comparator 6 during the sampling phase from the capacitor banks 3, 4. The two switches 31, 32 at the bottom of the diagram in turn short the inputs of the comparator to the mean value of the reference voltages. With the aid of the arrangement of FIG. 7, the working point can be held constant during the sampling phase and after the successive approximation phase. This allows the common mode component of the input voltage to be chosen freely within the range of the high-voltage supply.

Figure 8:
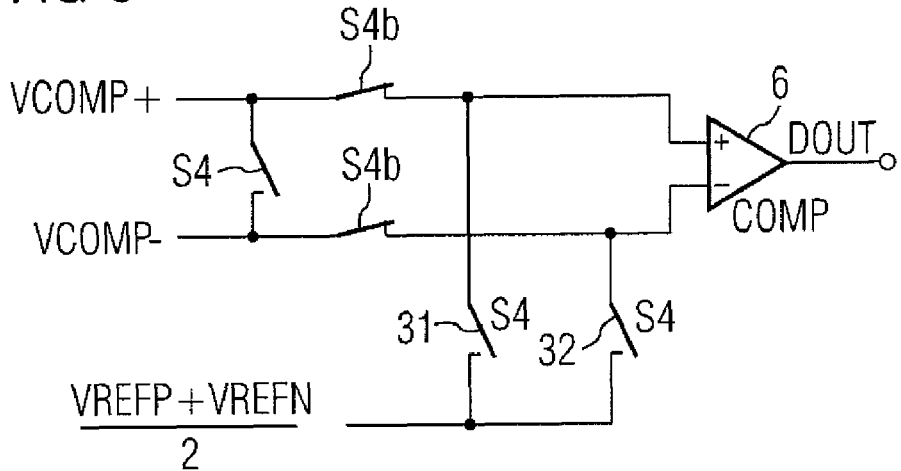
FIG. 8 shows a third example of an embodiment of the further sampling switch.

The process of ending the sampling phase and beginning the charge transfer phase by opening the sampling switch 54 is shown in FIG. 8. In this case, the further sampling switch S4 is opened first, as are the switches 31, 32 at the bottom of the diagram.

If the cross-connection switch S4 and the comparator input stage are implemented using high-voltage transistors, then no damage can be done to the cross-connection switch or to the comparator input stage even if there is a switching fault at the input of the analogue-digital converter. A switching fault could, for instance, be caused if insufficient attenuation were to be selected.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An analog/digital converter arrangement, comprising:
    a differential input through which an analog signal is supplied;
    a differentially structured, capacitive voltage divider whose connection to the differential input can be switched on and off and that comprises a plurality of programmable capacitor banks;
    a comparator having inputs connected to the differentially structured, capacitive voltage divider; and
    an output of the converter arrangement that is coupled to the an output of the comparator and in which a digital signal derived from the analog signal is provided;
    wherein during a sampling phase of the converter arrangement, the control unit connects a subset of capacitors in said plural programmable capacitor banks to the differential input and connects another subset of the capacitors in said plural programmable capacitor banks to a reference voltage to provide attenuation of the analog signal.

2. The converter arrangement according to claim 1, further comprising:
    a control unit having an input connected to the output of the comparator and an output connected to each of said plural programmable capacitor banks to operate each of said plural programmable capacitor banks, an output of the converter arrangement being formed at the control unit.

3. The converter arrangement according to claim 2, wherein the control unit includes a programming input at which a voltage divider ratio is selectable.

4. The converter arrangement according to claim 1, further comprising:
means for performing successive approximation in a charge transfer phase of the converter arrangement to convert a charge stored in each of said plural programmable capacitor banks into the digital signal.

5. The converter arrangement according to claim 1, further comprising:
means for equalizing a charge on the capacitors in each of said plural programmable capacitor banks in a discharge phase of the converter arrangement.

6. The converter arrangement according to claim 5, wherein the means for equalizing the charge on the capacitors in each of said plural programmable capacitor banks is configured to discharge the capacitors in each of said plural programmable capacitor banks in the discharge phase of the converter arrangement.

7. The converter arrangement according to claim 1, wherein the differentially structured, capacitive voltage divider is connected to the differential input through sampling switches.

8. The converter arrangement according to claim 7, wherein the inputs of the comparator are connected to one another through a further sampling switch.

9. The converter arrangement according to claim 7, wherein the sampling switches comprise high-voltage transistors.

10. The converter arrangement according to claim 9, wherein the sampling switches comprise high-voltage transistors, and the control unit is connected to control inputs of the high-voltage transistors by level conversion.

11. The converter arrangement according claim 9, wherein each of said binary sealed switchable capacitors is associated with a switch which couples each of said binary sealed switchable capacitors to one of the differential input of the converter arrangement, a positive reference signal terminal and a negative reference signal terminal, and the control unit is connected to the control inputs of the high-voltage transistors through by level conversion.

12. The converter arrangement according to claim 1, further comprising:
attenuating capacitors connected to a respective input of the comparator.

13. The converter arrangement according to claim 7, wherein a symmetrical circuit node is formed between the differentially implemented, capacitive voltage divider and the sampling switches, and is connected through first bypass switches, with inversion, to the inputs of the comparator.

14. The converter arrangement according to claim 13, further comprising:
attenuating capacitors connected to a respective input of the comparator;
wherein a free terminal of each of the attenuating capacitors is connected through reference switches to a complementary reference signal terminal and is connected through further bypass switches to the symmetrical circuit node.

15. The converter arrangement according to claim 1, wherein each of said programmable capacitor banks comprise a plurality of binary sealed switchable capacitors.

16. The converter arrangement according to claim 15, wherein each of said binary sealed switchable capacitors is associated with a switch which couples each of said binary sealed switchable capacitors to one of the differential input of the converter arrangement, a positive reference signal terminal and a negative reference signal terminal.

17. The converter arrangement according to claim 16, wherein switches assigned to each of said binary sealed switchable capacitors comprise high-voltage transistors.

18. A method of analog/digital conversion of a differential analog signal into a digital signal, comprising the steps of:
attenuating the differential analog signal using a differentially structured, capacitive voltage divider that comprises a plurality of programmable capacitor banks, through their programming;
supplying a differential signal derived from the differentially structured, capacitive voltage divider to a comparator;
generating the digital signal depending on an output signal from the comparator;
sampling the differential analog signal and supplying the differential analog signal to capacitors in each of said plural programmable capacitor banks in a sampling phase;
performing successive approximation to convert a charge stored in the capacitors in each of said plural programmable capacitor banks into the digital signal in a charge transfer phase; and
equalizing the charge on the capacitors in each of said plural programmable capacitor banks.

19. The method according to claim 18, wherein, in the sampling phase, the differential analog signal is supplied to a first subset of said plural programmable capacitors, while a second subset of said plural programmable capacitors is fed a differential reference signal.

20. The method according to claim 19, wherein a selection of which of said plural programmable capacitors are assigned to the first subset and which of said plural programmable capacitors are assigned to the second subset is performed in accordance with a specifiable attenuation of the differential analog signal.

21. The method according to claim 18, wherein each of said plural programmable capacitors, optionally and independently of one another, are connectable to one of a terminal of the differential analog signal, a positive reference signal terminal and a negative reference signal terminal.

22. An analog/digital converter arrangement, comprising:
a differential input through which an analog signal is supplied;
a differentially structured, capacitive voltage divider whose connection to the differential input can be switched on and off and that comprises a plurality of programmable capacitor banks;
a comparator having inputs connected to the differentially structured, capacitive voltage divider;
an output of the converter arrangement that is coupled to the an output of the comparator and in which a digital signal derived from the analog signal is provided; and
means for equalizing a charge on capacitors in each of said plural programmable capacitor banks in a discharge phase of the converter arrangement.

23. An analog/digital converter arrangement, comprising:
a differential input through which an analog signal is supplied;
a differentially structured, capacitive voltage divider whose connection to the differential input can be switched on and off and that comprises a plurality of programmable capacitor banks, the differentially structured, capacitive voltage divider being connected to the differential input through sampling switches;

a comparator having inputs connected to the differentially structured, capacitive voltage divider;

an output of the converter arrangement that is coupled to the an output of the comparator and in which a digital signal derived from the analog signal is provided; and a symmetrical circuit node formed between the differentially implemented, capacitive voltage divider and the sampling switches, said symmetrical circuit node being connected through first bypass switches, with inversion, to the inputs of the comparator.

24. An analog/digital converter arrangement, comprising:

a differential input through which an analog signal is supplied;

a differentially structured, capacitive voltage divider whose connection to the differential input can be switched on and off and that comprises a plurality of programmable capacitor banks;

a comparator having inputs connected to the differentially structured, capacitive voltage divider;

an output of the converter arrangement coupled to an output of the comparator and in which a digital signal derived from the analog signal is provided; and attenuating capacitors connected to a respective input of the comparator.

* * * * *